(12) United States Patent
Nentwig

(10) Patent No.: US 7,898,327 B2
(45) Date of Patent: Mar. 1, 2011

(54) CORRECTING DISTORTIONS AT OUTPUT OF POWER AMPLIFIER

(75) Inventor: Markus Nentwig, Helsinki (FI)

(73) Assignee: Nokia Corporation, Espoo (FI)

( * ) Notice: Subject to any disclaimer, the term of this patent is extended or adjusted under 35 U.S.C. 154(b) by 188 days.

(21) Appl. No.: 12/232,872

(22) Filed: Sep. 25, 2008

(65) Prior Publication Data

US 2010/0052781 A1     Mar. 4, 2010

(30) Foreign Application Priority Data

Aug. 29, 2008  (FI) ...................................... 20085808

(51) Int. Cl.
*H03F 1/26* (2006.01)
(52) U.S. Cl. .......................... 330/149; 330/136; 330/297
(58) Field of Classification Search .................. 330/127, 330/136, 149, 297
See application file for complete search history.

(56) References Cited

U.S. PATENT DOCUMENTS

| 7,091,777 B2* | 8/2006 | Lynch ............................ 330/149 |
| 7,095,278 B2* | 8/2006 | Fuller et al. .................... 330/149 |
| 2007/0019095 A1 | 1/2007 | Ikehata et al. |

FOREIGN PATENT DOCUMENTS

WO    PCT 2006/085177 A2    8/2006

* cited by examiner

*Primary Examiner* — Khanh V Nguyen
(74) *Attorney, Agent, or Firm* — Squire, Sanders & Dempsey (US) LLP

(57) ABSTRACT

A solution is provided for correcting distortions on a radio frequency output signal of a power amplifier. There is provided an apparatus, comprising: a processor configured to determine at least one correction factor for a distortion on a radio frequency output signal of a power amplifier on the basis of estimated characteristics of a distorted time-varying supply voltage from a power supply to a power amplifier and an interface configured to feed the at least one correction factor to an input signal of the power amplifier.

16 Claims, 2 Drawing Sheets

CORRECTING DISTORTIONS AT OUTPUT OF POWER AMPLIFIER

FIELD OF THE INVENTION

The invention relates generally to power amplification at radio frequencies. More specifically, the invention relates to correcting distortions at the output of a power amplifier.

BACKGROUND OF THE INVENTION

In order to achieve reliable transmission at radio frequencies from a transmitter to a distant receiver, a power amplifier is needed at the transmitter to increase the power level of a transmitted signal. Generally, a power supply provides supply voltage to the power amplifier. The power amplifier tends to consume a significant amount of battery energy and, as one solution for the excessive power consumption, a switched mode power supply (SMPS) is introduced. By using the SMPS, the battery life can be extended since the power amplifier can be controlled by the SMPS. In particular, a switching arrangement of the SMPS may connect the battery voltage to the power amplifier at the output of the SMPS in a controlled manner. The switching arrangement may switch the supply voltage to the power amplifier between on- and off-states, thus extending the battery life. The time-varying voltage output of the SMPS is applied as a supply voltage to the power amplifier. The SMPS operates on a periodic cycle and consequently the energy transfer is discontinuous. As a result, the output voltage of the SMPS exhibits distortions, such as a ripple. Since the varying output voltage of the SMPS is fed as supply voltage to the power amplifier, the output of the power amplifier, i.e., the transmitted radio frequency signal, may be distorted. Distortion causes, e.g., unwanted modulation of the transmitted signal, deteriorated signal quality and out-of-band spurious tones. In addition, ripple is not the only effect causing variation in the output voltage of the SMPS. For example, the load at the power amplifier (low/high input signal level) is a factor that may cause distortions at the output voltage of the SMPS.

There have been efforts in minimizing the ripple at the output voltage of the power supply by keeping the ripple below a given threshold. Selecting or adjusting the SMPS switching frequency such that the unwanted modulation caused by the ripple does not fall into desired frequency band or filtering out the ripple frequency are techniques that are currently used to combat the voltage variation.

In addition, distortions in the transmitted radio frequency signal may be corrected prior to the power amplifier. However, currently this technique does not take the distortions at the supply voltage, such as ripple, into account. Since these techniques do not completely remove the unwanted modulation of the transmitted signal, novel methods are needed that work against several imperfections of the power supply and, thus, correct the distortions in the transmitted radio frequency signal.

SUMMARY OF THE INVENTION

In accordance with an embodiment of the invention is to provide capability of correcting distortions at a power amplifier output in a transmitter with a power supply.

According to another embodiment of the invention, there may be a method that may receive a distorted time-varying supply voltage from a power supply. The method may determine at least one correction factor for a distortion on a radio frequency output signal of a power amplifier on the basis of estimated characteristics of the distorted time-varying supply voltage. The method may apply the at least one correction factor to an input signal of the power amplifier.

According to another embodiment of the invention, there may be an apparatus that may include a processor configured to determine at least one correction factor for a distortion on a radio frequency output signal of a power amplifier on the basis of estimated characteristics of a distorted time-varying supply voltage from a power supply. The apparatus may include an interface configured to apply the at least one correction factor to an input signal of the power amplifier.

According to a further embodiment of the invention, there may be an apparatus that may include a processing means for determining at least one correction factor for a distortion on a radio frequency output signal of a power amplifier on the basis of estimated characteristics of a distorted time-varying supply voltage from a power supply to a power amplifier. The apparatus may include an interface means for feeding the at least one correction factor to an input signal of the power amplifier.

According to another embodiment of the invention, there may be a computer readable storage medium encoded with instructions which, when executed by a computer, may provide a distorted time-varying supply voltage to a power amplifier from a power supply. The instructions may determine at least one correction factor for a distortion on a radio frequency output signal of the power amplifier on the basis of estimated characteristics of the distorted time-varying supply voltage. The instructions may apply the at least one correction factor to an input signal of the power amplifier.

According to another embodiment of the invention, there is provided a computer program product encoded on a computer-readable storage medium which, when executed by a computer, may provide a distorted time-varying supply voltage to a power amplifier from a power supply. The computer program product may determine at least one correction factor for a distortion on a radio frequency output signal of the power amplifier on the basis of estimated characteristics of the distorted time-varying supply voltage. The computer program product may apply the at least one correction factor to an input signal of the power amplifier.

Embodiments of the invention are defined in the dependent claims.

BRIEF DESCRIPTION OF THE DRAWINGS

In the following, the invention will be described in greater detail with reference to the embodiments and the accompanying drawings, in which.

DETAILED DESCRIPTION OF THE PREFERRED EMBODIMENTS

The following embodiments are exemplary. Although the specification may refer to "an", "one", or "some" embodiment(s) in several locations of the text, this does not necessarily mean that each reference is made to the same embodiment(s), or that a particular feature only applies to a single embodiment. Single features of different embodiments may also be combined to provide other embodiments.

Embodiments of the invention may be applied, for example, in Global System for Mobile Communications (GSM) and Evolved Universal Mobile Telecommunications System Terrestrial Radio Access Network (E-UTRAN). The E-UTRAN is also known as 3.9G or a Long Term Evolution (LTE) radio access network in the $3^{rd}$ generation partnership project (3GPP). The telecommunication system may have a fixed infrastructure providing wireless services to subscriber terminals. In general, the invention is not restricted to any specific network, but any communication network applying a transmitter with a power amplifier is suitable.

Figure 1:
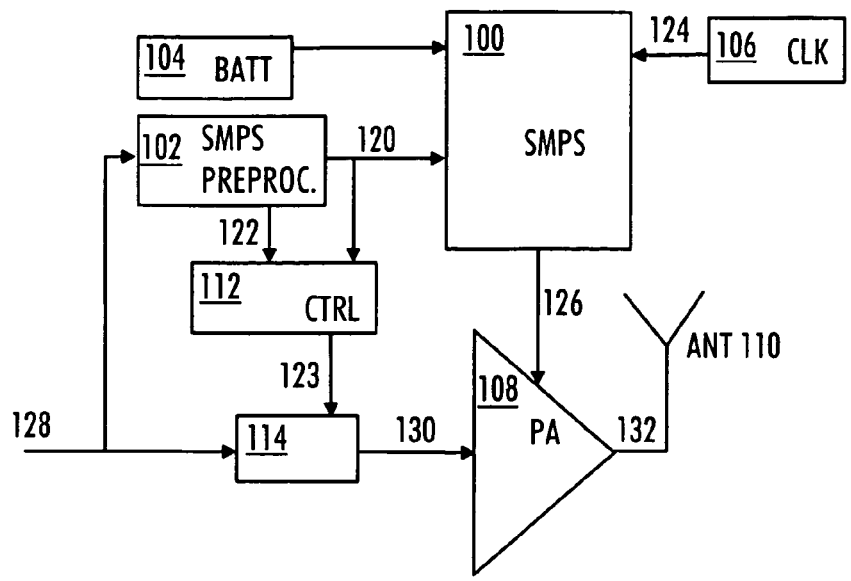
FIG. 1 presents a polar transmitter (PRIOR ART)

For example, the so-called polar transmitter is a possible transmitter type, in which the embodiments of the invention may be applied. An example of a polar transmitter, in which distortions of the transmitted radio frequency signal may be corrected, according to prior art, is shown in FIG. 1. The figure shows only elements and functional entities required for understanding the embodiment. Other components have been omitted for the sake of simplicity. The implementation of the elements and functional entities may vary from that shown in FIG. 1. The connections shown in FIG. 1 are logical connections, and the actual physical connections may be different. It is apparent to a person skilled in the art that a transmitter in a mobile telecommunication system may also comprise other functions and structures.

FIG. 1 shows an SMPS 100 in a polar transmitter feeding supply voltage 126 to a power amplifier 108. The transmitter applying the SMPS 100 is efficient in terms of power consumption since the SMPS 100 may switch the supply voltage 126 to the power amplifier 108 between on- and off-states, thus extending the lifetime of a battery 104. For that reason, the SMPS 100 comprises a switching regulator. By switching a power transistor of the SMPS 100 rapidly between on- and off-states (saturation and cutoff) with a certain cycle, the average output of the SMPS 100 may be the desired output voltage. The SMPS 100 operates on a periodic cycle. In the first step, the battery voltage is applied to an inductor in the SMPS 100, which is driven by current and stores magnetic energy. In the second step, the current is redirected to a capacitor at the output of the SMPS 100. However, other types of switched mode power supplies that combine a switching part and a linear regulator exist. The switching part and the linear regulator may be in parallel or in serial configuration. Thus, the actual structure of the SMPS 100 is not relevant regarding the applicability of the embodiments of the invention.

The transmitter may also comprise a clock 106 connected to the SMPS 100. The SMPS 100 may obtain a clock frequency from the clock 106 and the SMPS 100 may apply the clock frequency to determine the cycle in which the switching regulator switches the power transistor. In other words, the clock frequency is a switching frequency 124 of the SMPS 100. Typically, the switching frequency 124 may be between a few tens of hertz to one megahertz.

The object of the power amplifier 108 is to amplify an input signal of the power amplifier 108. The power amplifier 108 may be any type of power amplifier, which changes the amplitude of the input signal. Typically a power amplifier increases the amplitude of the signal, but alternatively the power amplifier may decrease amplitude of the signal. Further, the power amplifier may change the sign of the signal, that is, to invert the input signal. The radio frequency output signal 132 of the power amplifier 108 may thus be amplified and fed to an antenna 110 which may transmit the radio frequency output signal 132 of the power amplifier 108 to an air interface. Alternatively, the channel in which the signal is to be transmitted may be a wired transmission medium.

The transmitter may further comprise an SMPS preprocessor 102 that may provide the SMPS 100 with a control signal 120. The envelope of the input signal 128 may be detected at the SMPS preprocessor 102 and the control signal 120 representing the envelope may be fed to the SMPS 100. Further, the control signal may be fed to a processor 112.

The SMPS preprocessor 102 may further provide an amplitude signal 122 representing the magnitude of the input signal 128. The amplitude signal 122 may be fed to the processor 112. The processor 112 may be used in determining at least one correction factor 123 based on the control signal 120 and the amplitude signal 122, according to prior art. The control signal 120 may represent the nominal output of the SMPS 100. The at least one correction factor may be used to compensate for the distortions present at the radio frequency output signal 132 of a power amplifier 108. The at least one correction factor may include at least one of the following: an amplitude correction and a phase correction. The at least one correction factor may be determined by applying a look-up table. The look-up table may be indexed with both the amplitude 122 of the input signal 128 and the nominal output level of the supply voltage 126, according to prior art.

The at least one correction factor 123 may be combined with the input signal 128. The combination of the at least one correction factor 123 and the input signal 128 may be performed in an interface 114. The interface 114 may comprise, for example, multipliers and adders. Thus, a radio frequency signal 130 including the at least one correction factor 123 may be fed to the power amplifier 108.

The polar transmitter offers several advantages. For instance, lower power consumption, longer operation time and less heat dissipation due to increased efficiency. Here we define the polar transmitter as a transmitter in which a signal may be represented at some point with an amplitude branch that contains at least some amplitude information, and a phase branch that contains at least some phase information. For example, an envelope tracking transmitter or an envelope elimination and restoration transmitter may be considered to fall within the definition of a polar transmitter.

In general, the control method of the supply voltage to the power amplifier does not limit the applicability of the embodiments of the invention. Thus, even though the invention is described using the polar transmitter comprising the SMPS 100 as a basis, the invention could be applied in any apparatus where the characteristics of the power amplifier supply voltage may result in distortions at the output of the power amplifier.

Figure 2:
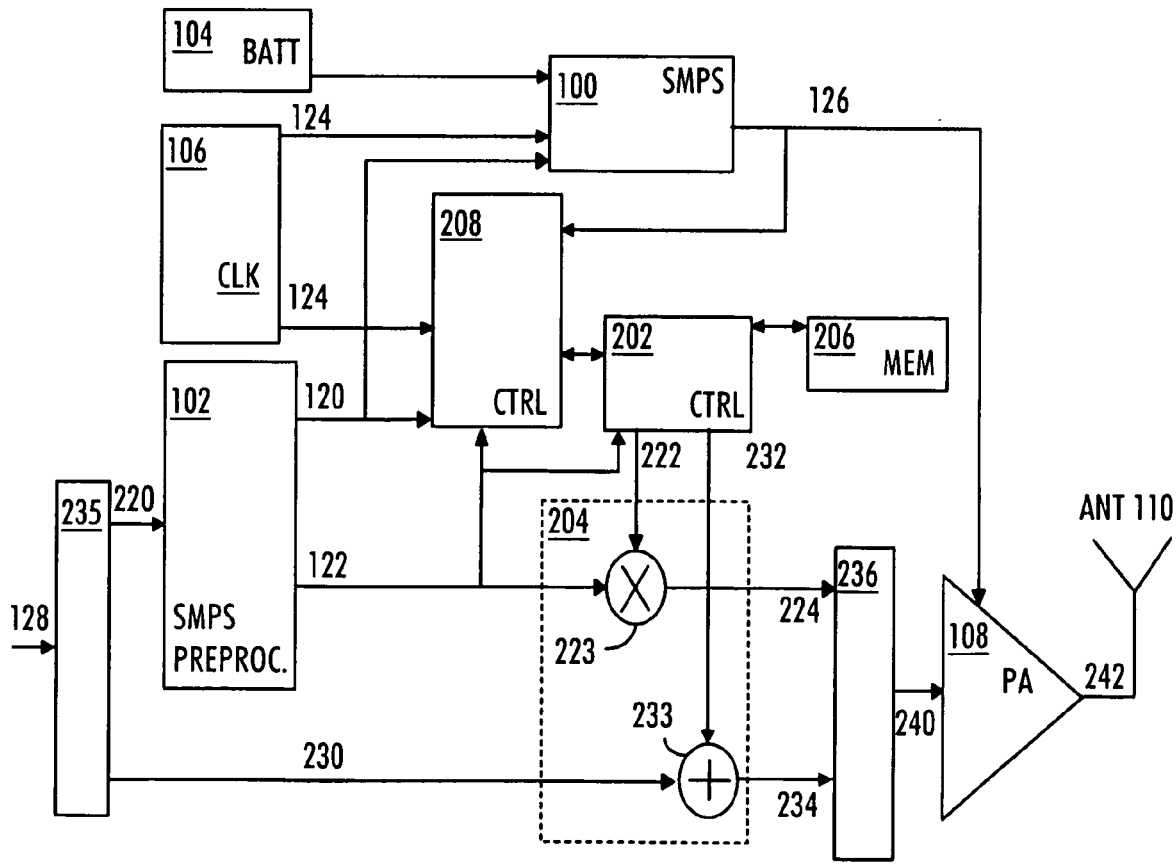
FIG. 2 shows an embodiment of the invention in a transmitter.

FIG. 2 shows an embodiment of the invention in the polar transmitter in which the distortion on the radio frequency output signal 242 of the power amplifier 108 may be corrected prior to the power amplifier 108. The figure shows only elements and functional entities required for understanding the embodiment. Other components have been omitted for the sake of simplicity. The implementation of the elements and functional entities may vary from that shown in FIG. 2. The connections shown in FIG. 2 are logical connections, and the actual physical connections may be different. It is apparent to a person skilled in the art that a transmitter in a mobile telecommunication system may also comprise other functions and structures.

The input signal 128 in FIG. 2 may be represented, after a radio frontend block 235, with a magnitude and a phase component 220 and 230, respectively. Depending on the design of the transmitter, the input signal 128 may include only the phase component 230. This may be the case in the elimination and restoration transmitter. In an envelope tracking transmitter, the input signal 128 may also comprise the magnitude component 220.

The input signal 128 may be understood as the input signal 128 of the power amplifier 108, even though the transmitter may perform signal-processing operations to the signal prior to the input signal 128 arrives at the input of the power amplifier 108. In any case, a linear relationship exists between the input signal 128 and the radio frequency output signal 242.

The clock 106 may provide the switching frequency 124 to the SMPS 100. The SMPS 100 may provide supply voltage 126 to the power amplifier 108. Since the SMPS 100 is driven by a clock signal, which determines the switching frequency, the energy transfer may be discontinuous and, consequently, the supply voltage 126 may exhibit a ripple. The ripple of the supply voltage 126 may cause unwanted effects such as modulation or distortion in the radio frequency output signal 242 of the power amplifier 108.

In addition, the supply voltage 126 may follow the magnitude component 220 of the input signal 128 causing the supply voltage 126 to be also time-varying.

The SMPS preprocessor 102 takes the magnitude component 220 of the input signal 128 as an input and determines the optimum supply voltage 126 to the power amplifier 108. The SMPS preprocessor 102 may then output the control signal 120 to the SMPS 100 representing the desired optimum supply voltage 126. In addition, the SMPS preprocessor 102 may output the amplitude signal 122 representing the magnitude of the input signal 128. For example, the amplitude signal 122 may follow the nominal magnitude of the input signal 128 closely or it may saturate to a constant value, depending on the design of the transmitter.

According to an embodiment, a power supply may provide a distorted time-varying supply voltage 126 to the power amplifier 108. The power supply may be, for example, the switched mode power supply 100. The time-varying supply voltage 126 is distorted due to the ripple caused by the discontinuous energy transfer at the SMPS 100. In addition, the distortion of the time-varying supply voltage 126 may be caused, for example, by a non-ideal frequency response or nonlinear behavior instead of the ripple. Thus, the distortion of the time-varying supply voltage 126 may be present in the frequency of the time-varying supply voltage 126 instead of the level of the time-varying supply voltage 126.

The transmitter may comprise a processor 202. The processor 202 may determine at least one correction factor for the distortion on the radio frequency output signal 242 of the power amplifier 108 on the basis of estimated characteristics of the distorted time-varying supply voltage 126 from the power supply, such as the SMPS 100, to the power amplifier 108. In other words, knowledge of the estimated characteristics of the distorted time-varying supply voltage 126 enables estimation of the resulting amplitude and phase error on the radio frequency output signal 242 of the power amplifier 108. The at least one correction factor may then be selected such that the at least one correction factor may cancel the distortion in the amplitude and phase once added to the input signal 128 of the power amplifier 108. The at least one correction factor may include at least one of the following: an amplitude correction and a phase correction.

In general, the characteristics may include any property that is predictable. The characteristics of the distorted time-varying supply voltage 126 may comprise at least one of the following: a level of the distorted time-varying supply voltage 126, a phase of the distorted time-varying supply voltage 126 and a frequency of the distorted time-varying supply voltage 126. For example, the characteristics may include a ripple, which is present on the distorted time-varying supply voltage 126.

In an embodiment, the processor 202 in FIG. 2 may be able to determine the instantaneous value of the ripple of the distorted time-varying supply voltage 126 at a given time based on the switching frequency 124 of the SMPS 100, a nominal output amplitude of the SMPS 100 and an average loading at the output of the SMPS 100 caused by the power amplifier 108. In addition, the characteristics of the power amplifier 108 may be known. The processor 202 may take the switching frequency 124 of the SMPS 100 as an input. Further, the control signal 120 to the SMPS 100 representing the desired supply voltage 126 may be applied as input to the processor 202 as well. Since, the characteristics of the power amplifier 108 are known, the processor 202 may be able to determine the instantaneous value of the distortion of the distorted time-varying supply voltage 126 at any given time.

In an embodiment, the transmitter may comprise a processor 208. The processor 208 may be logically connected to the processor 202. The processor 208 may sample the distorted time-varying supply voltage 126 for a number of predefined time periods at more than one time instants. The sampling may occur at the output of the SMPS 100. The processor 208 may thus sample the distorted time-varying supply voltage 126 several times, for example n times, during one time period. The time period may be, for example, the SMPS clock cycle determined by the clock 106. In other words, the time period is determined by the switching frequency 124 of the SMPS 100. The processor 208 may sample the level of the distorted time-varying supply voltage 126 or any other supply voltage characteristic, such as the phase or the frequency of the distorted time-varying supply voltage 126. The sampling may be achieved by an analog-to-digital converter (ADC).

Further, the processor 208 may subtract a nominal value of a supply voltage characteristic at each time period from the samples at the corresponding time period. In other words, the processor 208 may subtract the nominal value of the supply voltage characteristic, such as the nominal level of the time-varying supply voltage 126, at one time period from the n samples of that time period, resulting in n samples representing the distortion on the distorted time-varying supply voltage 126. In a case where the supply voltage characteristic is a level of the time-varying supply voltage 126, the nominal level of the time-varying supply voltage 126 does not include the ripple.

The processor 208 may further average the samples at corresponding time instants over more than one time period. In other words, the first samples in each time period may be averaged to one sample, the second samples of each time period may be averaged to one sample, etc. As a result, n samples representing the supply voltage characteristic over the time period may be obtained. For example, in a case where the supply voltage characteristic is a level of the time-varying supply voltage 126, the result of the averaging may be n samples representing the ripple over one time period, for example the SMPS clock cycle.

Thus, the processor 208 may generate a model for the distortion introduced to the time-varying supply voltage 126 by the power supply on the basis of the samples. The power supply may be, for example, the SMPS 100. The processor 208 may further estimate the characteristics of the distorted time-varying supply voltage 126, such as the ripple, on the basis of the model. The model may process the SMPS control signal 120 representing the desired optimum supply voltage 126 and output an estimate reflecting the distorted time-varying supply voltage 126 generated by the SMPS 100. In other words, the model may cover the dynamic behavior of the SMPS 100 including, for example, the ripple. The switching frequency 124 of the SMPS 100 may be provided to the model. Further, the model may apply the magnitude of the input signal 128 as input. The processor 208 may provide the processor 202 with the estimated characteristics of the distorted time-varying supply voltage 126.

The functionalities of the processor 208 may be performed in the processor 202 instead. Thus, the processor 208 may be omitted from the transmitter in FIG. 2. The processors 202 and 208 may be implemented with a digital signal processor provided with suitable software embedded on a computer readable medium, or with separate logic circuits, for example with an application-specific integrated circuit (ASIC).

As the processor 202 may be able to estimate the characteristics of the distorted time-varying supply voltage 126, the processor 202 may apply the estimated characteristics of the distorted time-varying supply voltage 126 when determining the at least one correction factor for the distortion on the radio frequency output signal 242 of the power amplifier 108. The processor 202 may further take into account the amplitude of the input signal 128 of the power amplifier 108 when determining the at least one correction factor. Thus, the at least one correction factor may be determined by applying both the instantaneous amplitude of the input signal 128 and the estimated characteristics of the distorted time-varying supply voltage 126, instead of the nominal value of a supply voltage characteristic without estimation of the distortion, as is the case in prior art.

The at least one correction factor may be determined by applying a look-up model. The look-up model may apply both the instantaneous amplitude of the input signal 128 and the estimated characteristics of the distorted time-varying supply voltage 126. The look-up model may be stored in a memory 206 connected to the processor 202. The at least one correction factor may be an inverse of the distortion on the radio frequency output signal 242 of the power amplifier 108. The look-up model may comprise values for the amplitude correction 222 and/or the phase correction 232.

The transmitter may further comprise an interface 204. The interface 204 may perform signal-processing operations for enabling a physical channel connection, if needed.

The interface 204 may feed the determined at least one correction factor to the input signal 128 of the power amplifier 108. The transmitter may have performed signal-processing operations to the input signal 128 prior to multiplying/adding the at least one correction factor to the input signal 128. The interface may comprise a multiplier 223 for multiplying the amplitude correction 222 with the amplitude signal 122. Further, the interface 204 may comprise an adder 233 for adding the phase correction 232 to the phase component 230. After multiplying/adding the amplitude and phase corrections 222 and 232, respectively, the amplitude and phase errors introduced to the radio frequency output signal 242 of the power amplifier 108 for a given input signal 128 are corrected. The at least one correction factor may be needed only for the amplitude signal 122 or for phase component 230. The amplitude and phase branches 224 and 234 including the amplitude and phase corrections 222 and 232, respectively, may be fed to a radio frontend block 236, which outputs a radio frequency signal 240 fed as input to the power amplifier 108. After being amplified by the power amplifier 108, the radio frequency output signal 242 is transmitted via the antenna 110.

Figure 3:
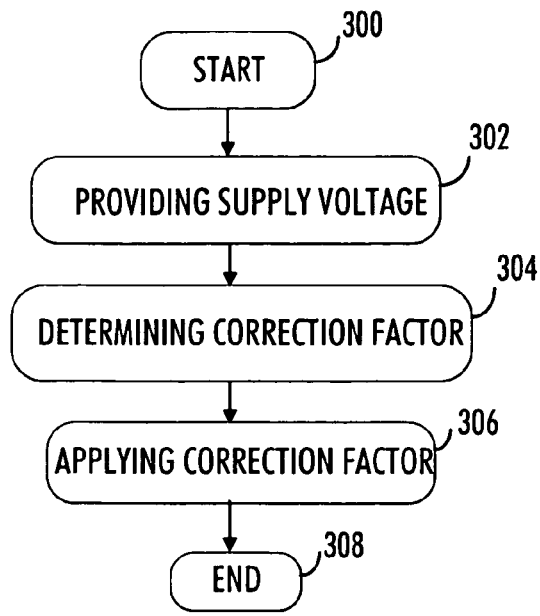
FIG. 3 shows a method for correcting distortions in a power amplifier output in a transmitter with a power supply.

FIG. 3 illustrates an example of a method for correcting distortions in a power amplifier output in a transmitter with a power supply. The method starts in step 300.

In step 302, a power supply, such as the SMPS, may provide supply voltage to a power amplifier, which may amplify the signal level prior to transmission. The supply voltage may be time-varying due to varying magnitude level of the input signal of the transmitter. Further, the time-varying supply voltage may be distorted due to discontinuous energy transfer at the SMPS causing distortion also at the transmitted radio frequency output signal of the power amplifier.

In step 304, the method comprises the processor determining the at least one correction factor for the distortion on the radio frequency output signal of the power amplifier on the basis of estimated characteristics of the distorted time-varying supply voltage. The processor may estimate the characteristics on the basis of the model for the distortion. The method for generating the model will be presented later in connection with FIG. 4. The at least one correction factor may include an amplitude correction and/or a phase correction. The at least one correction factor may be selected from the look-up model by applying the estimated characteristics of the distorted time-varying supply voltage and the amplitude of the input signal of the power amplifier.

The look-up model may be, for example, a function that may apply the instantaneous amplitude of the input signal and the estimated characteristics of the distorted time-varying supply voltage as variables and result in the at least one correction factor. Alternatively, the look-up model may be, for example, a table that may be indexed with both the instantaneous amplitude of the input signal and the estimated characteristics of the distorted time-varying supply voltage.

In step 306, the method comprises applying the at least one correction factor to an input signal of the power amplifier. The step 306 may comprise multiplying the amplitude correction with the amplitude signal and/or adding the phase correction to the phase component. The method ends in step 308.

Figure 4:
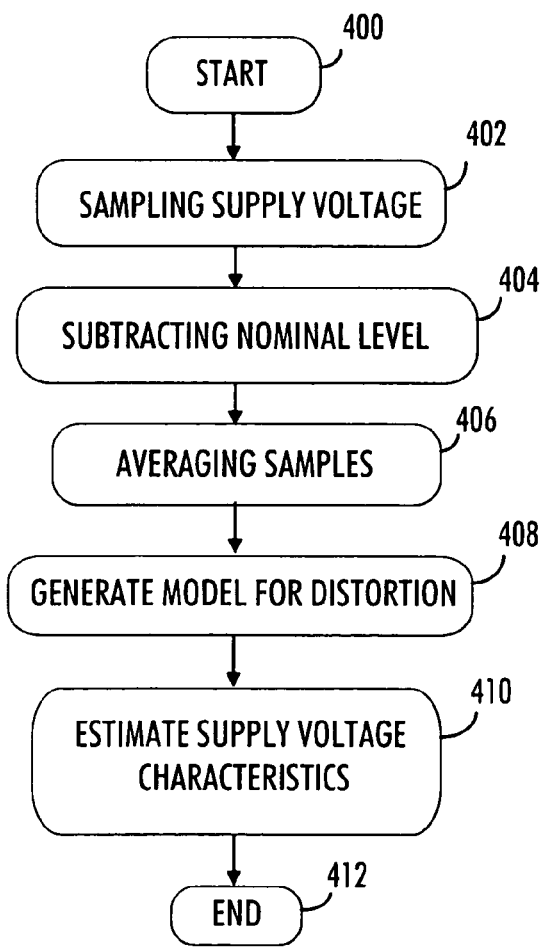
FIG. 4 illustrates a method for generating a model for estimating the characteristics of the distorted time-varying supply voltage.

FIG. 4 shows an example of a method for generating the model for estimating the characteristics of the distorted time-varying supply voltage. The method starts in step 400.

In step 402 the method continues by sampling the distorted time-varying supply voltage for a number of predefined time periods at more than one time instants. The processor may thus sample the distorted time-varying supply voltage 126 several times during one time period.

In step 404, the method comprises subtracting a nominal value of a supply voltage characteristic at each time period from the samples at the corresponding time period. For example in a case where the supply voltage characteristic is a level of the time-varying supply voltage, the nominal level of the time-varying supply voltage does not include the ripple. Thus, after subtracting the nominal value of the supply voltage characteristic, the samples represent the distortion regarding the characteristic.

Step 406 comprises averaging the samples at corresponding time instants over more than one time period. As a result, several samples representing the supply voltage characteristic over the time period, such as the clock cycle of the SMPS, may be obtained. For example, in a case where the supply voltage characteristic is a level of the time-varying supply voltage, the result of the averaging may be samples representing the ripple over one time period.

Step 408 of the method comprises generating the model for the distortion introduced to the time-varying supply voltage by the power supply on the basis of the samples. The model may represent the periodic behavior of the distortion, such as the ripple.

Step 410 of the method comprises estimating the characteristics of the distorted time-varying supply voltage on the basis of the model. The model may process the SMPS control signal and output an estimate reflecting the distorted time-varying supply voltage including the distortion effect, such as the ripple, generated by the SMPS. The method ends in step 412.

Embodiments of the invention may be implemented as computer programs in the apparatus. The computer programs comprise instructions for correcting the distortions in the power amplifier output. The computer program implemented in the apparatus may carry out, but is not limited to, the tasks related to FIGS. 2 to 4.

The computer program may be stored on a computer program distribution medium readable by a computer or a processor. The computer program medium may be, for example but not limited to, an electric, magnetic, optical, infrared or semiconductor system, device or transmission medium, RAM memory, flash memory, ROM memory, EPROM memory, EEPROM memory, registers, hard disk, a removable disk, a CD-ROM, or any other form of storage medium known in the art. The computer program medium may include at least one of the following media: a computer readable medium, computer-readable storage medium, program storage medium, record medium, computer readable memory, random access memory, erasable programmable read-only memory, computer readable software distribution package, computer readable signal, computer readable telecommunications signal, computer readable printed matter, and computer readable compressed software package.

Even though the invention has been described above with reference to an example according to the accompanying drawings, it is clear that the invention is not restricted thereto but can be modified in several ways within the scope of the appended claims. Further, it is clear to a person skilled in the art that the described embodiments may, but are not required to, be combined with other embodiments in various ways.

The invention claimed is:

1. A method, comprising:
   receiving a distorted time-varying supply voltage from a power supply;
   determining at least one correction factor for a distortion on a radio frequency output signal of a power amplifier on the basis of estimated characteristics of the distorted time-varying supply voltage; and
   applying the at least one correction factor to an input signal of the power amplifier.

2. The method according to claim 1, wherein the characteristics of the distorted time-varying supply voltage comprise at least one of the following: a level of the supply voltage, a phase of the supply voltage and a frequency of the supply voltage.

3. The method according to claim 1, further comprising:
   sampling the distorted time-varying supply voltage for a number of predefined time periods at more than one time instant;
   subtracting a nominal value of a supply voltage characteristic at each time period from the samples at the corresponding time period;
   averaging the samples at corresponding time instants over more than one time period;
   generating a model for the distortion introduced to the time-varying supply voltage by the power supply on the basis of the samples; and
   estimating the characteristics of the distorted time-varying supply voltage on the basis of the model.

4. The method according to claim 1, further comprising:
   taking the amplitude of the input signal of the power amplifier into account when determining the at least one correction factor.

5. The method according to claim 1, wherein the at least one correction factor is an inverse of the distortion on the radio frequency output signal of the power amplifier.

6. The method according to claim 1, wherein the power supply is a switched mode power supply.

7. An apparatus, comprising:
   a processor; and
   a memory including computer program code, the memory and the computer program code configured to, with the processor, cause the apparatus at least to determine at least one correction factor for a distortion on a radio frequency output signal of a power amplifier on the basis of estimated characteristics of a distorted time-varying supply voltage received from a power supply, and
   apply the at least one correction factor to an input signal of the power amplifier.

8. The apparatus according to claim 7, wherein the characteristics of the distorted time-varying supply voltage comprise at least one of the following: a level of the supply voltage, a phase of the supply voltage and a frequency of the supply voltage.

9. The apparatus according to claim 7, further comprising a sampling processor configured to:
   sample the distorted time-varying supply voltage for a number of predefined time periods at more than one time instant;
   subtract a nominal value of a supply voltage characteristic at each time period from the samples at the corresponding time period;
   average the samples at corresponding time instants over more than one time period;
   generate a model for the distortion introduced to the time-varying supply voltage by the power supply on the basis of the samples; and
   estimate the characteristics of the distorted time-varying supply voltage on the basis of the model.

10. The apparatus according to claim 7, wherein the memory and the computer program code are further configured to, with the processor, cause the apparatus at least to:
    take the amplitude of the input signal of the power amplifier into account when determining the at least one correction factor.

11. The apparatus according to claim 7, wherein the at least one correction factor is an inverse of the distortion on the radio frequency output signal of the power amplifier.

12. The apparatus according to claim 7, wherein the power supply is a switched mode power supply.

13. A computer-readable storage medium encoded with instructions which, when executed by a computer, performs:
    receiving a distorted time-varying supply voltage from a power supply;
    determining at least one correction factor for a distortion on a radio frequency output signal of a power amplifier on the basis of estimated characteristics of the distorted time-varying supply voltage; and
    applying the at least one correction factor to an input signal of the power amplifier.

14. A computer program product comprising program code encoded on a computer-readable storage medium which, when executed by a computer, performs:
    receiving a distorted time-varying supply voltage from a power supply;
    determining at least one correction factor for a distortion on a radio frequency output signal of a power amplifier on the basis of estimated characteristics of the distorted time-varying supply voltage; and
    applying the at least one correction factor to an input signal of the power amplifier.

15. An apparatus, comprising:
    determining means for determining at least one correction factor for a distortion on a radio frequency output signal of a power amplifier on the basis of estimated characteristics of a distorted time-varying supply voltage received from a power supply to a power amplifier; and
    interface means for applying the at least one correction factor to an input signal of the power amplifier.

16. The apparatus according to claim 15, further comprising:
    processing means for:
    sampling the distorted time-varying supply voltage for a number of predefined time periods at more than one time instant;
    subtracting the level of the nominal supply voltage at each time period from the samples at the corresponding time period;
    averaging the samples at corresponding time instants over more than one time period;
    generating a model for the distortion introduced to the time-varying supply voltage by the power supply on the basis of the samples; and
    estimating the characteristics of the distorted time-varying supply voltage on the basis of the model.

\* \* \* \* \*